US012112803B2

(12) United States Patent
Lee et al.

(10) Patent No.: US 12,112,803 B2
(45) Date of Patent: Oct. 8, 2024

(54) MEMORY DEVICE AND PROGRAMMING METHOD THEREOF

(71) Applicant: MACRONIX International Co., Ltd., Hsinchu (TW)

(72) Inventors: Ya-Jui Lee, Taichung (TW); Kuan-Fu Chen, Taipei (TW)

(73) Assignee: MACRONIX International Co., Ltd., Hsinchu (TW)

( * ) Notice: Subject to any disclaimer, the term of this patent is extended or adjusted under 35 U.S.C. 154(b) by 173 days.

(21) Appl. No.: 18/090,499

(22) Filed: Dec. 29, 2022

(65) Prior Publication Data

US 2024/0221835 A1    Jul. 4, 2024

(51) Int. Cl.
  *G11C 16/08* (2006.01)
  *G11C 16/28* (2006.01)

(52) U.S. Cl.
  CPC .............. *G11C 16/08* (2013.01); *G11C 16/28* (2013.01)

(58) Field of Classification Search
  CPC ..... G11C 16/08; G11C 16/28; G11C 11/5628; G11C 16/0483; G11C 16/10
  USPC .................................................... 365/185.23
  See application file for complete search history.

(56) References Cited

U.S. PATENT DOCUMENTS

| | | | |
|---|---|---|---|
| 9,460,805 | B1 | 10/2016 | Pang et al. |
| 10,892,023 | B2 | 1/2021 | Wang et al. |
| 2011/0286274 | A1 | 11/2011 | Chang et al. |
| 2013/0163326 | A1 | 6/2013 | Lee et al. |
| 2014/0269080 | A1 | 9/2014 | Lee |
| 2014/0293693 | A1 | 10/2014 | Nam et al. |
| 2018/0190498 | A1 | 7/2018 | Lee |
| 2019/0074065 | A1* | 3/2019 | Park ................... G11C 16/0483 |
| 2019/0130962 | A1 | 5/2019 | Lee |
| 2019/0198117 | A1 | 6/2019 | Yu et al. |
| 2021/0264984 | A1 | 8/2021 | Yamabe et al. |

(Continued)

FOREIGN PATENT DOCUMENTS

| | | |
|---|---|---|
| JP | 2018536959 | 12/2018 |
| KR | 20210110378 | 9/2021 |

(Continued)

OTHER PUBLICATIONS

"Office Action of Korea Counterpart Application", issued on Apr. 16, 2024, with English translation thereof, pp. 1-26.

(Continued)

*Primary Examiner* — Huan Hoang
(74) *Attorney, Agent, or Firm* — J.C. PATENTS

(57) ABSTRACT

A memory device and programming method thereof are provided. A memory cell array includes a first dummy word line set, plural word lines and a second dummy word line set in sequence. The method includes: grouping the word lines into word line groups; generating at least one pass bias set having plural pass biases that are respectively corresponding to each word line group; selecting one word line for programming, and determining that the selected word line belongs to a specific word line group; and according to a programming sequence, applying a corresponding pass bias in the plural pass biases of the at least one pass bias set to at least one dummy word line in one of the first and the second dummy word line sets, wherein the corresponding pass bias corresponds to the specific word line group.

20 Claims, 7 Drawing Sheets

(56) References Cited

U.S. PATENT DOCUMENTS

2022/0036952 A1  2/2022  Lee

FOREIGN PATENT DOCUMENTS

TW  201839773  11/2018
WO  2017069869  4/2017

OTHER PUBLICATIONS

"Office Action of Japan Counterpart Application", issued on Jan. 10, 2024, pp. 1-5.
"Search Report of Europe Counterpart Application", issued on Aug. 10, 2023, p. 1-p. 9.
"Office Action of Taiwan Counterpart Application", issued on Jun. 27, 2024, pp. 1-5.
"Office Action of Taiwan Counterpart Application", issued on Dec. 1, 2023, p. 1-p. 8.

* cited by examiner

MEMORY DEVICE AND PROGRAMMING METHOD THEREOF

BACKGROUND

Technical Field

The present invention relates to an operation method of a memory device, and more particularly, to a memory device and a programming method thereof.

Description of Related Art

Recently, more and more mobile electronic devices, such as tablets, laptops, smart phones, or solid-state drivers, have started to adopt NAND flash memory as the main data storage device. The demand for low cost and high density NAND flash memory has been rapidly increased. However, the limitation of lithography technology, the cell-to-cell interference, and the reduction of the number of electrons stored in the floating gate hinder further downscaling of the floating-gate NAND flash memory. In order to overcome the scaling issues of NAND flash memory, various types of three-dimensional (3D) stacked charge trap NAND flash memories have been considered as a breakthrough because of the scalability, easy fabrication and coupling-free characteristics of these memories.

However, as the number of layers of the 3D memory structure increases from 48 to 96, 128 and more, the word line pattern effect in the memory cell array tends to be severe, and the effect of programming the last few word lines (word lines at the bottom side) causes poor channel boosting. Thus, programming disturbance becomes a problem as the 3D memory structure stacks high.

FIG. 1 is a schematic diagram of voltage application during the programming. When programming the memory cell array, the programming bias VP is applied to the selected word line, and the pass bias VPASSP is applied to the unselected word lines, so that the unselected word lines are not enabled. In addition, the memory cell array further includes dummy word lines, and the dummy word lines are also applied with the pass bias VPASSP during the programming. In the existing method, when the selected word line is programmed, the pass bias VPASSP applied to the dummy word lines is fixed.

FIG. 2A is a graph showing the relationship between the threshold voltage of the dummy word line and the times of programming each word line, in which the horizontal axis represents the threshold voltage VT of the dummy word line DWLB0, and the vertical axis is the times of programming each word line. The value of the threshold voltage VT is recorded every time when the programming of each of the word lines is performed. However, as can be seen from FIG. 1, when the programming is performed from the top word line WL95 to the bottom word line WL0 of the 3D NAND flash memory, the threshold voltage VT of the dummy word line DWBL0 is gradually increased with the increase of times of programming.

FIG. 2B is a schematic diagram illustrating that the threshold voltage of the dummy word line is disturbed to a high voltage. As shown in FIG. 2B, the horizontal axis is the number of the word line, sequentially from the word line WL95 to the word line WL0, and the vertical axis is the threshold voltage VT of the dummy word line DWLB0. As can be seen from FIG. 2B, after the word line WL95 to the word line WL0 are programmed in sequence, the threshold voltage VT of the dummy word line DWLB0 is disturbed from about 0.5V and rises to about 3V.

The high threshold voltage VT of the dummy word line DWLB0 will cause GIDL (gate induce drain leak) leakage and the channel voltage Vch is reduced when programming the bottom word lines, resulting in the poor channel voltage boosting. Although the lower pass bias VPASSP can prevent the threshold voltage of the dummy word line DWLB0 from being disturbed to a high voltage, there is a problem of insufficient channel voltage boosting. As a result, programming the bottom word lines will cause a poor program distribution.

Therefore, it is necessary to develop a programming method for a 3D NAND flash memory.

SUMMARY

Based on the above description, the present invention provides a memory device and a programming method thereof. When programming each word line, the pass bias voltage is dynamically applied to the dummy word line, rather than applying a fixed pass bias for each word line programming.

According to an embodiment of the present invention, a programming method for a memory device is provided. The memory device has a memory cell array that includes a first dummy word line set, a plurality of word lines and a second dummy word line set arranged in sequence. The programming method comprising: grouping the plurality of word lines into a plurality of word line groups; generating at least one pass bias set, the at least one pass bias set having a plurality of pass biases that are respectively corresponding to each of the plurality of word line groups; selecting one of the plurality of word lines for programming, and determining that the selected word line belongs to a specific word line group of the plurality of word line groups; and according to a programming sequence, applying a corresponding pass bias in the plurality of pass biases of the at least one pass bias set to at least one dummy word line in one of the first dummy word line set and the second dummy word line set, wherein the corresponding pass bias corresponds to the specific word line group.

According to another embodiment of the present invention, a memory device is provided and comprises a memory cell array, including a first dummy word line set, a plurality of word lines and a second dummy word line set arranged in sequence; and a memory control circuit, controlling the memory cell array. The memory control circuit further performs a programming operation, comprising: grouping the plurality of word lines into a plurality of word line groups; generating at least one pass bias set, the at least one pass bias set having a plurality of pass biases that are respectively corresponding to each of the plurality of word line groups; selecting one of the plurality of word lines for programming, and determining that the selected word line belongs to a specific word line group of the plurality of word line groups; and according to a programming sequence, applying a corresponding pass bias in the plurality of pass biases of the at least one pass bias set to at least one dummy word line in one of the first dummy word line set and the second dummy word line set, wherein the corresponding pass bias corresponds to the specific word line group.

According to the embodiment of the present invention, in the programming method, when the programming sequence is a side of the first dummy word line set to a side of the second dummy word line side, the at least one pass bias set is applied to the at least one dummy word line of the second dummy word line set.

According to the embodiment of the present invention, in the programming method, the closer the specific word line group of the plurality of word line groups is to the second dummy word line set, the corresponding pass bias in the plurality of pass biases is higher.

According to the embodiment of the present invention, in the programming method, a fixed pass bias is applied to dummy word lines other than the at least one dummy word line of the second dummy word line set.

According to the embodiment of the present invention, in the programming method, an another dummy word line other than the at least one dummy word line of the second dummy word line set is applied with an another pass bias set.

According to the embodiment of the present invention, in the programming method, numbers of word lines in each of the plurality of word line groups are equal or different.

According to the embodiment of the present invention, in the programming method, the plurality of pass biases in the at least one pass bias set has different values.

According to the embodiment of the present invention, in the programming method, two adjacent pass biases among the plurality of pass biases in the at least one pass bias set are equal.

According to the embodiment of the present invention, in the programming method, the memory device is a two-dimensional or three-dimensional NAND flash memory.

According to the embodiment of the present invention, in the programming method, the memory cells of the memory device are single-level cells, double-level cells, triple-level cells or quad-level cells.

According to the above embodiment of the present invention, the pass bias applied to the dummy word line can be dynamically changed as different word lines are programmed. When programming the word line to be programmed is farther away from the dummy word line, the dummy word line is applied with a lower pass bias, so as to prevent the threshold voltage of the dummy word line from being disturbed high. When the word line to be programmed closer to the dummy word line, the dummy word line is applied with a higher pass bias, so as to prevent the GIDL leakage and enhance the channel voltage boosting. In this manner, by the programming method of the embodiment of the present invention, the program disturbance can be significantly improved.

DESCRIPTION OF THE EMBODIMENTS

The embodiment of the present invention is a programming method of a memory device. Taking 3D NAND flash memory as an example, the 3D NAND flash memory has a memory cell array that includes a first set of dummy word lines, a plurality of word lines and a second set of dummy word lines arranged in sequence. In the programming method, the plurality of word lines is grouped into a plurality of word line groups. At least one pass bias set having a plurality of pass biases that are respectively corresponding to each of the plurality of word line groups is generated. Then, one of the plurality of word lines is selected for programming. It determines that the selected word line belongs to a specific word line group of the plurality of word line groups. According to a programming sequence, a corresponding pass bias in the plurality of pass biases of the at least one pass bias set is applied to at least one of dummy word lines in one of the first dummy word line set and the second dummy word line set. The corresponding pass bias corresponds to the specific word line group. Next, the programming method of the embodiment of the present invention will be described in detail.

Hereinafter, a 3D NAND flash memory will be used as an illustrative example, but the present invention is not limited to this, and any 3D memory structure can be applied. In addition, the present invention can also be applied to 2D memory.

Figure 1:
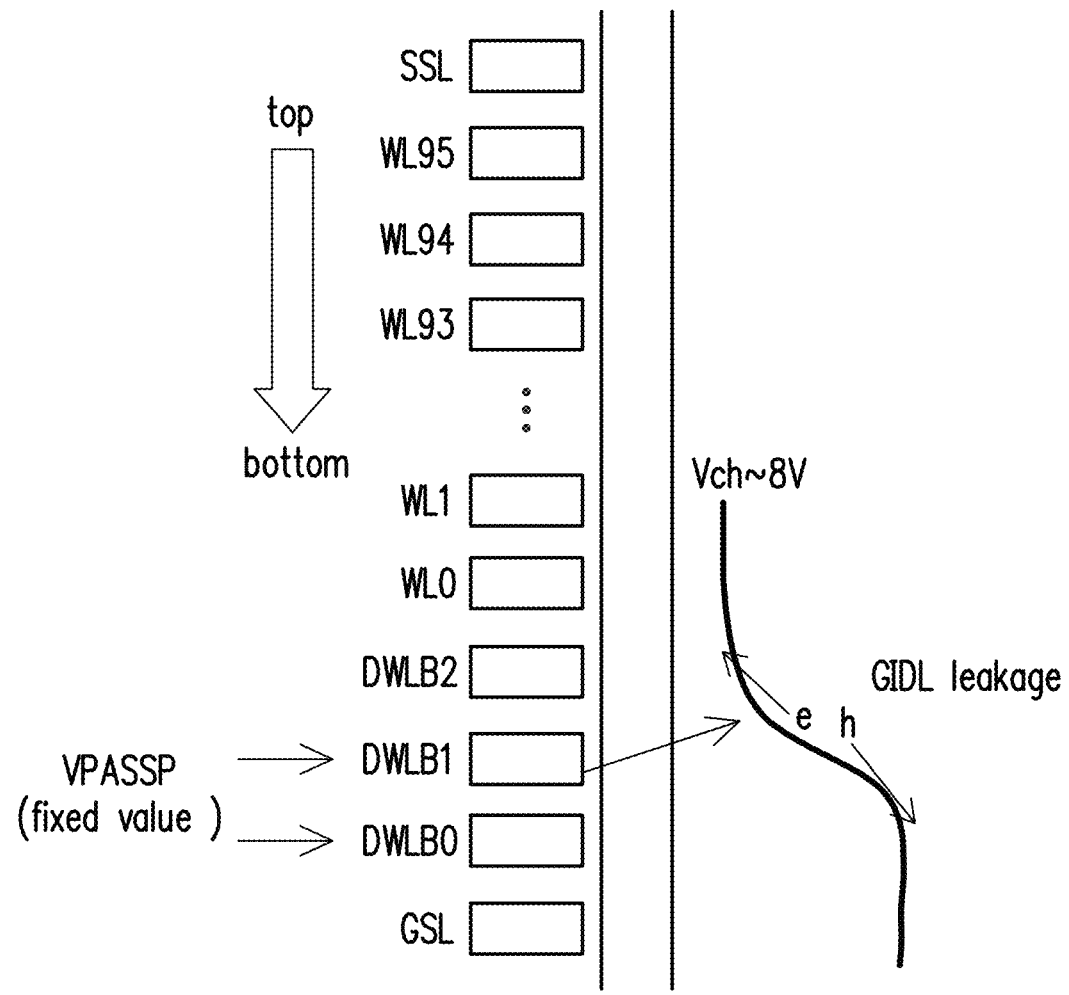
FIG. 1 is a schematic diagram of voltage application during programming.
Figure 2A:
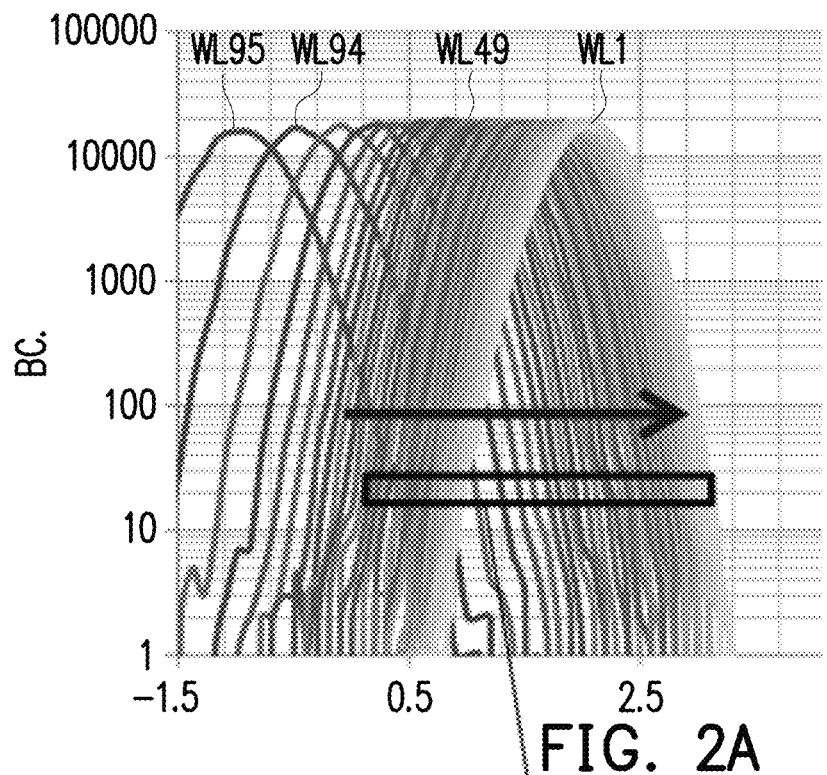
FIG. 2A is a graph showing the relationship between the threshold voltage of the dummy word line and the number of times of programming each of word lines.
Figure 2B:
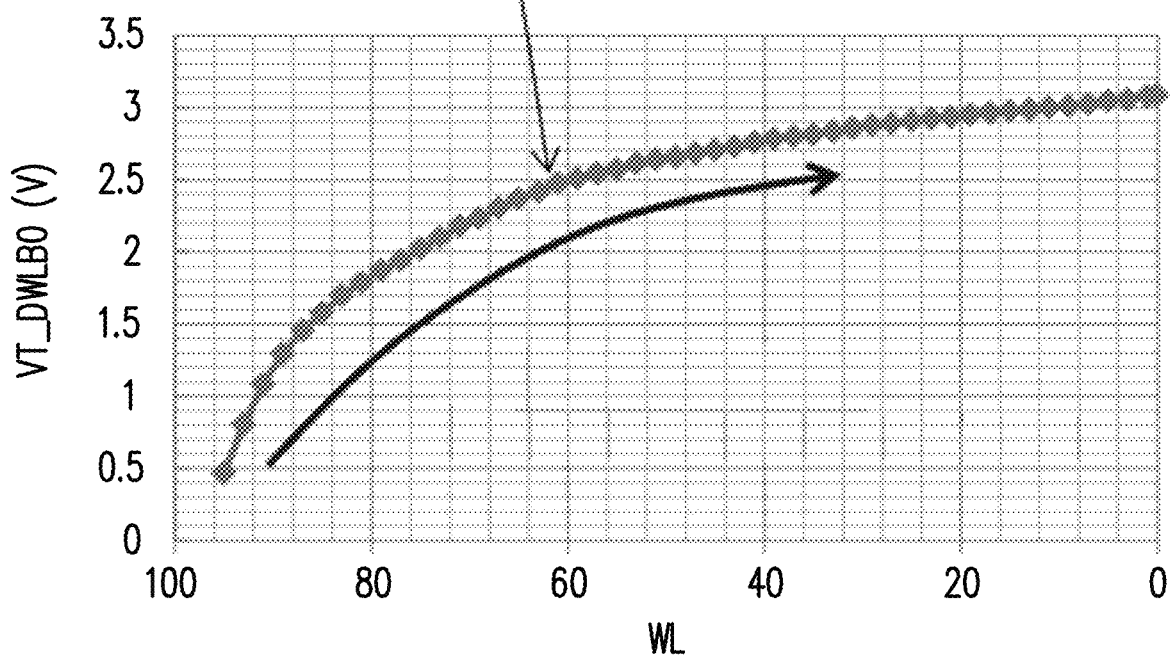
FIG. 2B is a schematic diagram illustrating that the threshold voltage of the dummy word line is disturbed to a high voltage.
Figure 3:
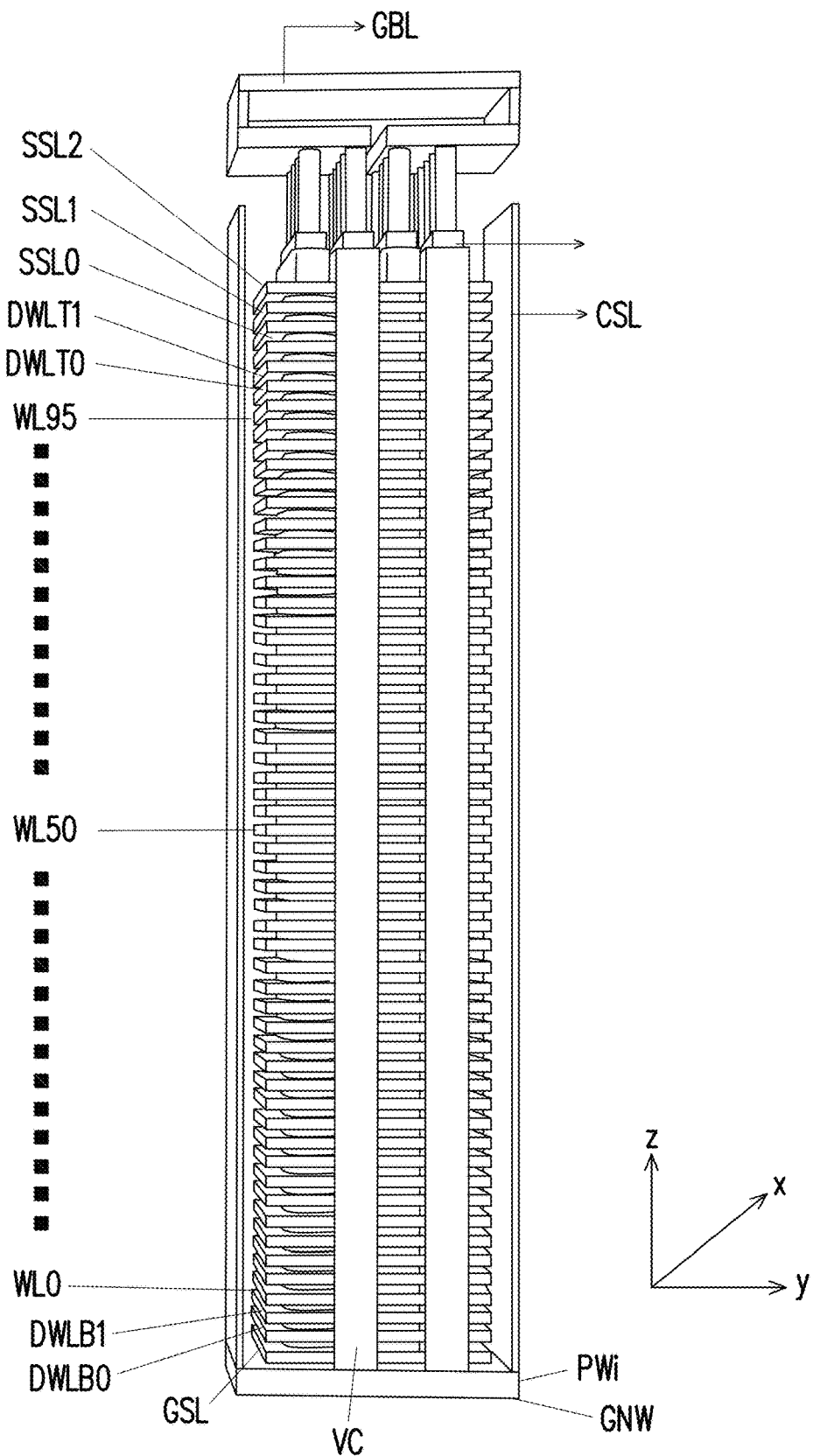
FIG. 3 is a schematic diagram illustrating a three-dimensional memory structure.

FIG. 3 illustrates a memory structure as an application example of the embodiment of the present invention, which illustrates a partial structure of a 3D NAND flash memory. The schematic structure of the 3D NAND flash memory shown in FIG. 3 has a plurality of word lines WL0~WL95 (96 word lines are used as an example) formed in the vertical direction z, and the vertical channel VC is also formed along the three-dimensional vertical direction z. Each word line extends in the xy plane. In addition, bottom dummy word lines DWLB1 and DWLB0 are further arranged below word line WL0, and top dummy word lines DWLT1 and DWLT0 are also arranged above word line WL95. Here, although two bottom dummy word lines and two top dummy word lines are illustrated, their numbers are not particularly limited, and can be appropriately adjusted according to requirements.

In addition, the 3D NAND flash memory may further comprise a common source line (CSL), which connects the source lines together. The 3D NAND flash memory may also comprise select lines SSL0, SSL1, SSL2, etc., which may be disposed above the top dummy word line DWLT1. The 3D NAND flash memory can also comprise a global source line (GSL) on the lower side of the bottom dummy word line, and a global bit line (GBL) that may be formed above the top dummy word line to connect the bit lines. The structure of the 3D NAND flash memory shown in FIG. 3 is only for convenience of understanding the relationship between the word lines (data word lines) WL0~WL95 and the dummy word lines, and is not intended to limit the implementation of the present invention.

Figure 4:
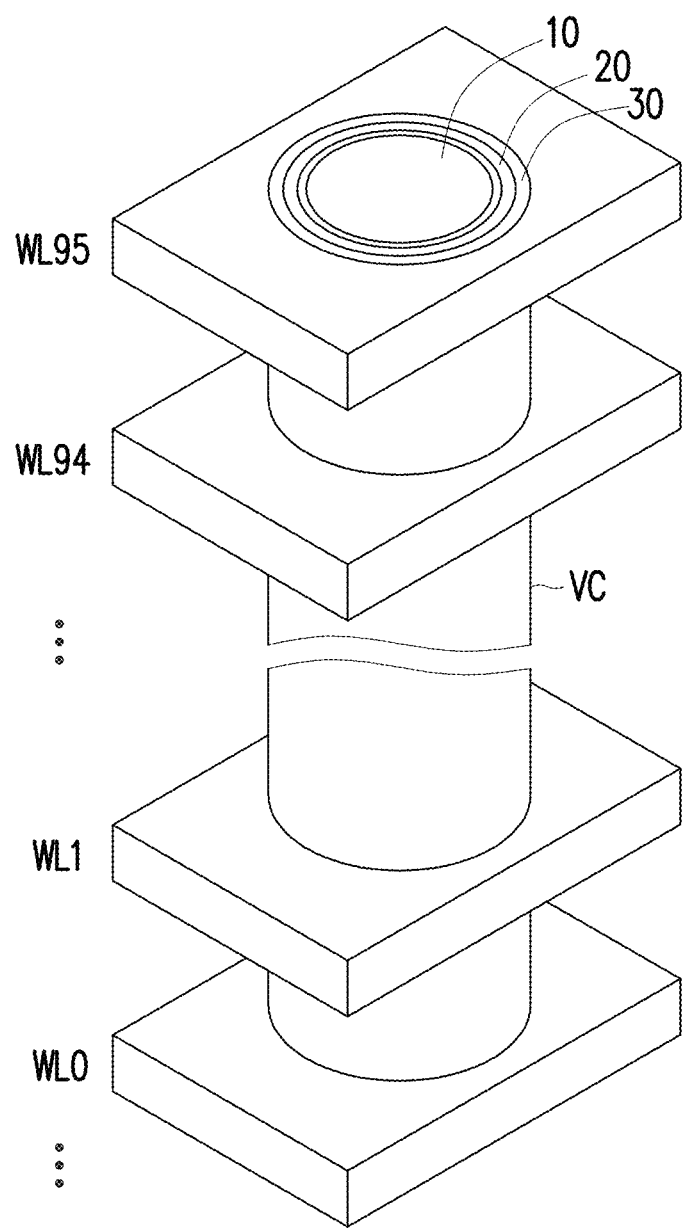
FIG. 4 is a schematic diagram showing the structure of each word line.

FIG. 4 is a schematic diagram showing the structure of each word line, which is an enlarged view of the word lines shown in FIG. 3. As shown in FIG. 4, the 3D NAND flash memory comprises plurality of word lines WL0~WL95, which are penetrated by the vertical channels VC. The vertical channel VC has a dielectric layer core 10, a channel layer 20 surrounding the dielectric layer core 10, and a charge trapping layer 30 between each of the word lines WL0~WL95 and the channel layer 20. The channel layer 20 is formed of, for example, polysilicon, and the charge trapping layer is formed of, for example, an oxide-nitride-oxide (ONO) layer. The structure illustrated here is only an example of a 3D NAND memory to which the programming method of the present invention can be applied, and the method of the present invention is not limited to any memory structure.

The programming method of the embodiment of the present invention is to group a plurality of word lines into a plurality of word line groups WLGi (i=1~n, n groups). In addition, the pass bias applied to the dummy word line (e.g., the aforementioned dummy word line DWLB0) is dynamically changed according to which word line group the word line selected during programming belongs to. Basically, when the word line group to which the selected word line belongs to is closer to the dummy word line, the pass bias applied to the dummy word line is higher.

According to an embodiment of the present invention, the pass bias applied to the dummy word line may be selected from a pass bias set, and the pass bias set comprises a plurality of pass biases VPASSPi (i=1~n, n pass biases). That is, the number of the pass biases VPASSPi of the pass bias set may be the same as the number of the word line group WLGi. Once it is determined which word line group WLGi the selected word line belongs to, the pass bias voltage VPASSPi corresponding to the determined word line group is applied to the dummy word line. In this way, during programming, the pass bias VPASSPi can be dynamically applied to the dummy word line according to the word line group WLGi to which the selected word line belongs.

In addition, taking the dummy word line as the bottom dummy word line as an example, the word line group WLGi is sequentially arranged from the top word lines to the bottom word lines. During the program operation, when the word line groups (such as WLG(n−1), WLGn, etc.) are farther away from the bottom dummy word line, the corresponding pass biases VPASSP(n−1) and VPASSPn are smaller. When the word line groups (such as word line group WLG1, WLG2, etc.) are closer to the bottom dummy word line, the corresponding pass biases VPASSP1 and VPASSP2 are higher. Therefore, the plurality of pass biases VPASSPi of the pass bias set satisfy the following relationship VPASSPi<VPASSPj,1≤i,j≤n and i<j.

By the programming method described above, the pass bias VPASSPi applied to the dummy word line can be dynamically changed as different word lines are programmed. When a word line that is farther from the dummy word line is selected for programming (i.e., the word line that was programmed earlier), the dummy word line is applied with a smaller pass bias VPASSP. Thereby, the threshold voltage VT of the dummy word line can be prevented from being disturbed high. When a word line closer to the dummy word line is selected for programming (i.e., the last few word lines to be programmed), the dummy word line is applied with a larger pass bias VPASSP. Thereby, GIDL leakage can be prevented and channel voltage boosting can be enhanced. Therefore, by using the programming method of the embodiment, the program disturbance can be significantly improved.

In addition, the grouping of word lines can be made in any manner to fit the manufacturing process conditions. The above programming method can be applied to all dummy word lines. The programming method according to the embodiment of the present invention is further described below with reference to the drawings. During programming, a pass bias can be dynamically applied to the dummy word line.

Figure 5:
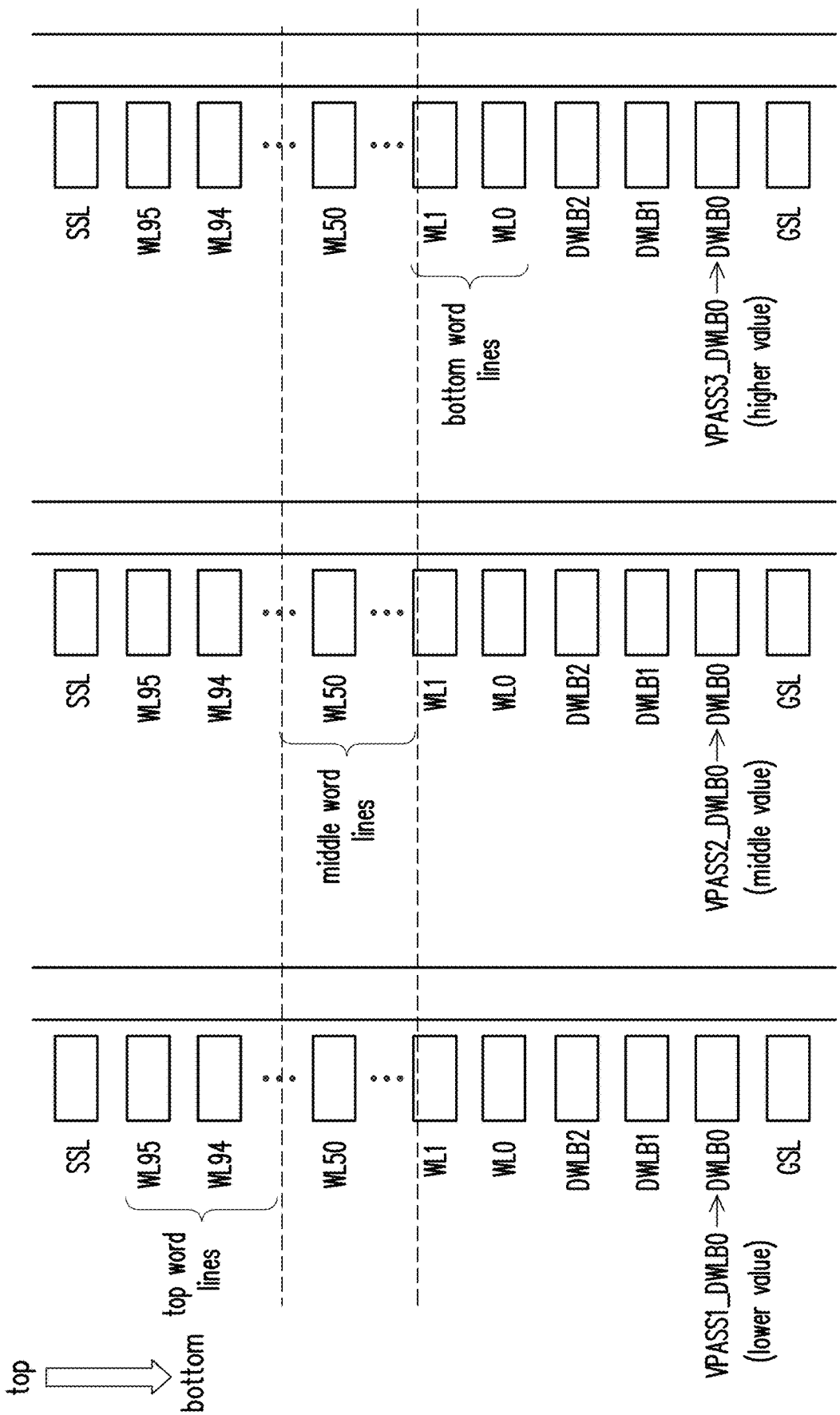
FIG. 5A to FIG. 5C illustrate a method for applying a pass bias voltage to a dummy word line according to a programming method of an embodiment of the present invention.

FIG. 5A to FIG. 5C illustrate the conceptual schematic diagrams of the programming method according to the embodiment of the present invention. As mentioned above, in the programming method of the present invention, the pass bias applied to the dummy word line is made in a dynamical application manner, rather than applying a fixed pass bias VPASSP.

Here, the 3D NAND flash memory shown in FIG. 3 is also used as an example, and there are 96 word lines WL0~WL95 and 3 dummy word lines DWLB2, DWLB1, DWLB0 in sequence that are located at the bottom of the 3D NAND flash memory and under the word line WL0. Below the dummy word line DWLB0 is the gate select line GSL. Here, the number of word lines and dummy word lines is only for convenience of description, and is not particularly limited in the present invention.

In addition, the word lines are divided into three groups as an explanatory example, in which a first group includes the word lines near the top such as word lines WL94, WL95, etc. A second group includes the word lines that are close to the middle position, such as the word lines above and below the word line WL50. A third group includes the word lines near the bottom such as the word lines WL1, WL0, etc. Here, the above grouping is merely used to describe the concept of the dynamic application of the pass biases VPASSPi on the dummy word lines DWLB0 to DWLB2, and the boundary of each word line group is not particularly limited (i.e., the grouping manner). In addition, this embodiment is described using the sequential programming operation from the top word line WL95 to the bottom word line WL0 as an example, but the programming sequence may be from the bottom word line WL0 to the top word line WL95. Besides, in addition to the sequential programming operation, the programming method of the present invention can also be applied to the programming operation with arbitrarily selecting the word line.

As shown in FIG. 5A, when the word line WL94 is selected for programming the memory cell, the word line WL94 belongs to the first word line group near the top. At this time, the programming bias VP is applied to the selected word line WL94, and the pass bias VPASSP is applied to the unselected word lines WL0 to WL93 and WL95. In addition, a pass bias VPASSP1_DWLB0 is applied to the dummy word line DWLB0. Here, the word line WL94 is far away from the dummy word line DWLB0, and the pass bias voltage VPASSP1_DWLB0 has a lower value.

As shown in FIG. 5B, when the word line WL50 is selected for programming the memory cell, the word line WL50 belongs to the second word line group near the middle. At this time, the programming bias VP is applied to the selected word line WL50, and the pass bias VPASSP is applied to the unselected word lines WL0-WL49 and WL51-WL95. In addition, a pass bias voltage VPASSP2_DWLB0 is applied to the dummy word line DWLB0. The pass bias VPASSP2_DWLB0 is higher than the pass bias VPASSP1_DWLB0. Here, the word line WL50 is closer to the dummy word line DWLB0 than the word line WL95, and the pass bias VPASSP2_DWLB0 has a middle value.

As shown in FIG. 5C, when the word line WL1 is selected for programming the memory cell, the word line WL1 belongs to the third word line group near the bottom. At this time, the programming bias VP is applied to the selected word line WL1, and the pass bias voltage VPASSP is applied to the unselected word lines WL0, WL2 to WL95. In addition, a pass bias VPASSP3_DWLB0 is applied to the dummy word line DWLB0. The pass bias VPASSP3_DWLB0 is greater than the pass bias voltage VPASSP2_DWLB0. Here, the word line WL1 is closer to the dummy word line DWLB0 than the word line WL50, and the pass bias VPASSP3 DWLB0 has a higher value.

In addition, in this embodiment, although the number of word lines in each of 6 wordline groups is not the same, the present invention is not limited to this grouping manner, and the number of word lines in each word line group may also be equal.

Table 1 lists exemplary examples of the pass biases that can be applied to each of the bottom dummy word lines DWLB0~DWLB2 according to the programming method of the embodiment of the present invention.

TABLE 1

| WLGr | DWLB0 | DWLB1 | DWLB2 |
|---|---|---|---|
| 1 | VPASSP1_DWLB0 = 2 V | VPASSP1_DWLB1 = 4 V | VPASSP1_DWLB2 = 6 V |
| 2 | VPASSP2_DWLB0 = 2.5 V | VPASSP2_DWLB1 = 4.5 V | VPASSP2_DWLB2 = 6.5 V |
| 3 | VPASSP3_DWLB0 = 3 V | VPASSP3_DWLB1 = 5 V | VPASSP3_DWLB2 = 7 V |
| 4 | VPASSP4_DWLB0 = 3.8 V | VPASSP4_DWLB1 = 5.8 V | VPASSP4_DWLB2 = 7.8 V |
| 5 | VPASSP5_DWLB0 = 4.6 V | VPASSP5_DWLB1 = 6.6 V | VPASSP5_DWLB2 = 8.6 V |
| 6 | VPASSP6_DWLB0 = 5.5 V | VPASSP6_DWLB1 = 7.5 V | VPASSP6_DWLB2 = 9.5 V |

From the above descriptions, the pass biases VPASSPi_DWLB0 (i=1~3) applied to the dummy word line DWLB0 is dynamically changed with different word lines, i.e., VPASSP1_DWLB0 (corresponding the top (first) word line group)<VPASSP2_DWLB0 (corresponding the middle (second) word line group)<VPASSP3_DWLB0 (corresponding the bottom (third) word line group).

In the above illustrative example, the pass bias can be dynamically applied to the dummy word line DWLB0, but the dynamic application method may be further applied to the dummy word line DWLB1, or all the dummy word lines DWLB0~DWLB2 can use the dynamic application method.

Hereinafter, an example is further given to illustrate a specific example of the programming method according to the embodiment. In the embodiment, the 3D NAND flash memory shown in FIG. 3 is still taken as an example, and there are 96 word lines WL0~WL95 and 3 dummy word lines DWLB2, DWLB1, DWLB0 in sequence that are located at the bottom of the 3D NAND flash memory and under the word line WL0. Below the dummy word line DWLB0 is the gate select line GSL. Here, the number of word lines and dummy word lines is only for convenience of description, and is not particularly limited in the present invention.

Also, in this example, the programming sequence is from the top to the bottom, i.e., from the word line WL95 to the word line WL0. Of course, the programming sequence may also be from the bottom to the top, and the present invention does not particularly limit the programming sequence.

In this example, the 96 word lines WL0 to WL95 are divided into the following 6 groups.
  word line group WLG1: word lines WL48~95
  word line group WLG2: word lines WL24~47
  word line group WLG3: word lines WL12~23
  word line group WLG4: word lines WL6~11
  word line group WLG5: word lines WL3~5
  word line group WLG6: word lines WL0~2

In this example, the number of word lines in each group is different. The number of word lines in the word line group 1 closer to the top is larger, such as 48; the number of word lines in the word line group WLG6 closest to the bottom is smaller, such as 3. Of course, the example of the present invention does not specifically limit the number of the word line groups, which can be divided into less than or more than 6 groups, depending on the actual requirements for dealing with program disturbance.

Table 1 provides three pass bias sets to be respectively applied to the bottom dummy word lines DWLB0~DWLB2 during programming. According to an embodiment of the present invention, the object to which the dynamic pass bias application is applied may be at least one of the plurality of bottom dummy word lines DWLB0~DWLB2. In this example, the first pass bias set including pass biases VPASSP1_DWLB0~VPASSP6_DWLB0 is applied to the bottom dummy word line DWLB0 as an example for illustration.

In this example, the programming method is performed in a sequence from the top word line WL95 to the bottom word line WL0. As the selected word line is closer to the bottom dummy word line DWLB0, the higher the pass bias is applied. The pass biases in first pass bias set are increased and applied to the dummy word line DWLB0, which may include 6 pass biases VPASSP1_DWLB0~VPASSP6_DWLB0, and these 6 pass biases satisfy the following relationship:

VPASSP1_DWLB0 (corresponding to the WLG1)
<VPASSP2_DWLB0 (corresponding to the WLG2)<VPASSP3_DWLB0 (corresponding to the WLG3)<VPASSP4_DWLB0 (corresponding to the WLG4)<VPASSP5_DWLB0 (corresponding to the WLG5)<VPASSP6_DWLB0 (corresponding to the WLG6).

Here, the 6 pass biases correspond to the above 6 word line groups WLG1 to WLG6 respectively. For example, when the word line WL95 is selected for programming, the word line WL95 belongs to word line group WLG1. The selected word line WL95 is the farthest from the bottom dummy word line DWLB0. The pass bias of the bottom dummy word line DWLB0 corresponding to the word line group WLG1 is the pass bias VPASSP1_DWLB0. Therefore, when the word line WL95 is selected for programming, the pass bias VPASSP1_DWLB0 is applied to the bottom dummy word line DWLB0. In addition, when the word line WL23 is selected for programming, the word line WL23 belongs to the word line group WLG3. The selected word line WL23 is closer to the bottom dummy word line DWLB0. The pass bias of the bottom dummy word line DWLB0 corresponding to the word line group WLG3 is the pass bias VPASSP3_DWLB0. Therefore, when the word line WL23 is selected for programming, the pass bias VPASSP3_DWLB0 is applied to the bottom dummy word line DWLB0. Furthermore, when the word line WL2 is selected for programming, the word line WL2 belongs to word line group WLG6. The distance between the bottom dummy word line DWLB0 and the selected word line WL2 is very short. The pass bias of the bottom dummy word line DWLB0 corresponding to the word line group WLG6 is the pass bias VPASSP6_DWLB0. Therefore, when the word line WL2 is selected for programming, the pass bias VPASSP6_DWLB0 is applied to the bottom dummy word line DWLB0. As described above, according to the embodiment of the present invention, when the word line group to which the selected word line belongs is closer to the bottom dummy word line DWLB0, the pass bias VPASSPi_DWLB0 applied to the bottom dummy word line DWLB0 will be dynamically increased.

Furthermore, in the above example, the pass bias is dynamically changed and applied to only one of the bottom dummy word lines DWLB0 according to the word line to be programmed. At this time, the other bottom dummy word lines DWLB1 and DWLB2 may be applied with a fixed pass bias VPASSP, that is, the same as the pass bias VPASSP applied to the unselected word lines. According to the embodiment of the present invention, as long as one of the bottom dummy word lines is applied with the pass bias in the dynamic application manner, the problem of the threshold voltage VT of the dummy word line being disturbed to a high voltage can be suppressed, the GIDL leakage can be prevented and the channel voltage boosting can be enhanced.

In addition, according to another embodiment of the present invention, the other bottom dummy word lines DWLB1 and DWLB2 can also be dynamically applied with a pass bias like the bottom dummy word line DWLB0. At this time, for example, the second pass bias set including pass biases VPASSP1_DWLB1 to VPASSP6_DWLB1 can be applied to the bottom dummy word line DWLB1. In addition, for example, the third pass bias set including pass biases VPASSP1_DWLB2 to PASSP6_DWLB2 can also be applied to the bottom dummy word line DWLB2. In addition, the second pass bias set and the third pass bias set are applied in the same dynamic manner as the first pass bias set.

Here, the first to third pass bias sets have the following relationship. In each pass bias set, for the pass biases corresponding to the same word line group, the pass bias is larger as the target dummy word line is closer to the word line side. As shown in Table 1, the bottom dummy word line DWLB2 is closer to the word line side than the bottom dummy word lines DWLB1, DWLB0. The pass bias VPASSPi_DWLB2 is larger than the pass biases VPASSPi_DWLB1, and the pass biases VPASSPi_DWLB1 is larger than the pass biases VPASSPi_DWLB0.

Additionally, the pass biases in each pass bias set are different and increased. According to another embodiment of the present invention, the pass biases in in each pass bias set may increase progressively, but two adjacent pass biases may be the same. For example, taking the first pass bias set as an example, the pass biases may increase progressively like 2V, 2.5V, 3V, 3V, 4.6V, and 5.5V.

Figure 6:
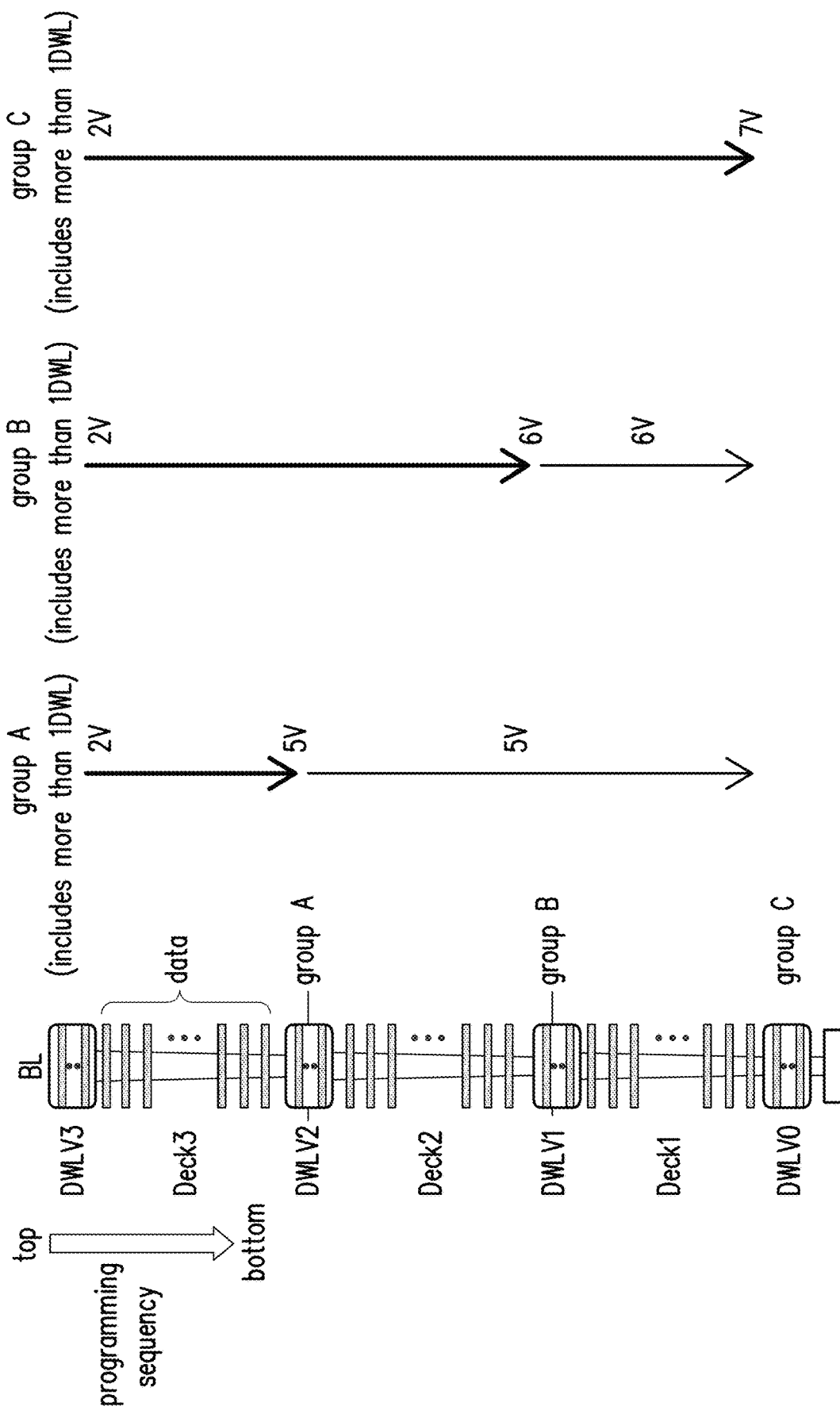
FIG. 6 is an application example according to another embodiment of the present invention.

FIG. 6 is an application example according to another embodiment of the present invention. In the 3D memory illustrated in FIG. 6, the stack of word lines may include a plurality of deck structures (decks), each of the deck structures may be a structure as shown in FIG. 3. Each deck structure has the dummy word line sets on the upper and lower sides. In the example of FIG. 6, the word line stack includes three deck structures Deck1, Deck2, and Deck3 stacked in sequence. In addition, the word line stack may include dummy word line sets DWLV3, DWLV2, DWLV1, DWLV0 sequentially from the top to the bottom.

Next, take the programming sequence from the top to the bottom as an example. In the example of group A shown in FIG. 6, when the selected word line for programming is in deck structure Deck3, the dynamic pass bias application described above can be applied to at least one dummy word line in the dummy word line set DWLV2. In this example, the voltage range of the dynamic pass bias in at least one dummy word line in the dummy word line set DWLV2 is, for example, 2V~5V. Still in group A, when the selected word line for programming passes deck structure Deck3, the pass bias for the at least one dummy word line in the dummy word line set DWLV2 keeps at 5V. In addition, as in the example of group B shown in FIG. 6, when the selected word line is in the deck structure Deck3 or Deck2, the dynamic pass bias application described above can be applied to at least one dummy word line in the dummy word line set DWLV1. In this example, the voltage range of the dynamic pass bias in at least one dummy word line in the dummy word line set DWLV1 is, for example, 2V~6V. Still in group B, when the selected word line for programming passes deck structure Deck2, the pass bias for the at least one dummy word line in the dummy word line set DWLV1 keeps at 6V. In addition, as shown in the example of group C in FIG. 6, when the selected word line is in the deck structure Deck3, Deck2 or Deck1, the dynamic pass bias application described above can be applied to the dummy word line set DWLV0 in the at least one of them. In this example, the voltage range of the dynamic pass bias in at least one dummy word line in the dummy word line set DWLV0 is, for example, 2V~7V. Still in group C, when the selected word line for programming is close to the bottom of deck structure Deck1, the pass bias for the at least one dummy word line in the dummy word line set DWLV0 is close to 7V. For the dummy word line sets DWLV0 to DWLV2, the dummy word line set DWLV0 is bottommost. The maximum pass bias for the dummy word line set DWLV0 is larger than the maximum pass bias for the dummy word line set DWLV1. The maximum pass bias for the dummy word line set DWLV1 is larger than the maximum pass bias for the dummy word line set DWLV2. Likewise, in this embodiment, the pass bias applied to the dummy word line can also be dynamically changed with the selected word line.

In addition, the above example illustrates the word line is selected for programming in a sequence from the top to the bottom, but as mentioned above, word lines can also be selected for programming in a sequence from the bottom to the top. The targets for applying the dynamic pass bias are the dummy word line sets DWLV3, DWLV2, and DWLV1.

Figure 7:
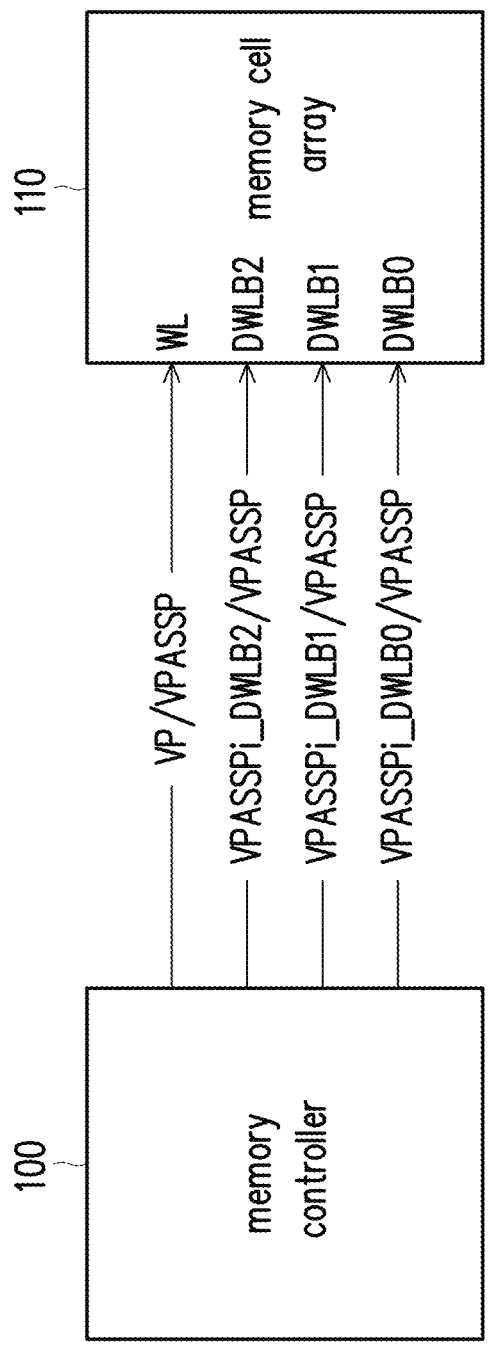
FIG. 7 is a block diagram illustrating a control circuit of a flash memory according to an embodiment of the present invention.

FIG. 7 is a block diagram illustrating a control circuit of a flash memory according to an embodiment of the present invention. FIG. 7 shows a simplified schematic diagram, regarding the actual circuit architecture and functional blocks such as row decoders, column decoders, voltage generation circuits, various buffers, control logic, I/O circuits, etc., those skilled in the art can appropriately design according to their needs based on the concept of the present invention.

As shown in FIG. 7, the flash memory includes at least but not limited to the memory control circuit 100 and the memory cell array 110. The memory cell array 100 comprises a plurality of memory cells arranged in an array. The memory cell array 100 further comprises a first dummy word line set, a plurality of word lines, a second dummy word line set arranged in sequence. The memory cell array 110 may further comprise a common source line and bit lines, etc., and by applying biases voltage to the plurality of word lines, the common source line and the bit line, the operations such as reading, programming or erasing, are performed on the memory cells in the flash memory. Here, the memory cell array 110 is not particularly limited. As mentioned above, the memory cell array 100 can be a 3D or 2D NAND flash memory cell array.

The memory control circuit 100 is basically used to control all operations of the memory cell array 110, including reading, programming, and erasing, etc. Here, the programming method is described, and the reading and erasing operations can be any existing operation methods, which are omitted.

The memory control circuit 100 generates a programming bias VP to selected word lines, a fixed pass bias VPASSP to unselected word lines, and a plurality of pass biases VPASSPi applied to the dummy word lines (provided to at least one of the dummy word lines). The memory control circuit 100 can divide a plurality of word lines into word line groups. The grouping can be written into the memory control circuit 100 in the factory after manufacture, or can be grouped by programming manner after being shipped out of the factory. Here, for the grouping method of word lines, please refer to the above detailed description.

In this example, the programming sequence from the top to the bottom is still used for illustration, and the memory cell array 110 includes bottom dummy word lines DWLB0-DWLB2. As mentioned above, the programming bias VP generated by the memory controller 100 is applied to the selected word lines, and the other unselected word lines are applied with the fixed pass bias VPASSP. In addition, after a specific word line is selected, the memory controller 100 can determine which word line group the specific word line belongs to. Next, one of the bottom dummy word lines DWLB0~DWLB2 can be selected as the target to which the dynamic pass biases VPASSPi are applied. The memory controller 100 can generate corresponding pass biases VPASSPi_DWLB0, VPASSPi_DWLB1, and VPASSPi_DWLB2 for each of the bottom dummy word lines DWLB0~DWLB2.

If at least one of the bottom dummy word lines DWLB0~DWLB2 (e.g., DWLB0) is selected to be applied the dynamic pass biases, when programming each word line, the pass bias VPASSPi_DWLB0 will be provided to the bottom dummy word line DWLB0. In addition, the other bottom dummy word lines DWLB1~DWLB2 may be applied with the fixed pass bias VPASSP, or may be applied with the dynamic pass biases VPASSPi_DWLB1 and VPASSPi_DWLB2. The detail programming method can be referred to the above descriptions, which is omitted here.

The above embodiment takes the 3D NAND flash memory as an illustrative example, but the present invention is not limited to NAND type flash memory. Other types of memory can also be applied. Furthermore, in addition to the 3D NAND flash memory, the programming method of the present invention can also be applied to the 2D flash memory. In addition, the grouping method is the same as the above-embodiment, and will not be described here.

In addition, the programming method of the present invention is not only applicable to 2D or 3D memory, and can also be applied to memory cells that store 1-bit single-level cells (SLC), 2-bit double-layer cells, 3-bit triple-level cells (Triple-level cell, TLC) or a quad-level cell (QLC, or a multi-level cell (MLC)) that stores four bits or more.

In summary, according to the present invention, by using the aforementioned programming method, the pass bias applied to the dummy word lines can be dynamically changed as different word lines are programmed. When programming the word lines farther away from the dummy word line, the dummy word line is applied with a lower pass bias, thereby preventing the threshold voltage of the dummy word line from being disturbed high. When programming the word lines closer to the dummy word line, the dummy word line is applied with a higher pass bias, thereby preventing GIDL leakage and enhancing the channel voltage boosting. Thus, by the programming method of the embodiment of the present invention, the program disturbance can be significantly improved.

What is claimed is:

1. A programming method for a memory device, wherein the memory device has a memory cell array that includes a first dummy word line set, a plurality of word lines and a second dummy word line set arranged in sequence, the programming method comprising:
   grouping the plurality of word lines into a plurality of word line groups;
   generating at least one pass bias set, the at least one pass bias set having a plurality of pass biases that are respectively corresponding to each of the plurality of word line groups;
   selecting one of the plurality of word lines for programming, and determining that the selected word line belongs to a specific word line group of the plurality of word line groups; and
   according to a programming sequence, applying a corresponding pass bias in the plurality of pass biases of the at least one pass bias set to at least one dummy word line in one of the first dummy word line set and the second dummy word line set, wherein the corresponding pass bias corresponds to the specific word line group.

2. The programming method according to claim 1, wherein when the programming sequence is a side of the first dummy word line set to a side of the second dummy word line side, the at least one pass bias set is applied to the at least one dummy word line of the second dummy word line set.

3. The programming method according to claim 2, wherein, the closer the specific word line group of the plurality of word line groups is to the second dummy word line set, the corresponding pass bias in the plurality of pass biases is higher.

4. The programming method according to claim 2, wherein a fixed pass bias is applied to dummy word lines other than the at least one dummy word line of the second dummy word line set.

5. The programming method of a memory device according to claim 2, wherein an another dummy word line other than the at least one dummy word line of the second dummy word line set is applied with an another pass bias set.

6. The programming method according to claim 1, wherein numbers of word lines in each of the plurality of word line groups are equal or different.

7. The programming method according to claim 1, wherein the plurality of pass biases in the at least one pass bias set has different values.

8. The programming method of a memory device according to claim 1, wherein two adjacent pass biases among the plurality of pass biases in the at least one pass bias set are equal.

9. The programming method according to claim 1, wherein the memory device is a two-dimensional or three-dimensional NAND flash memory.

10. The programming method according to claim 1, wherein the memory cells of the memory device are single-level cells, double-level cells, triple-level cells or quad-level cells.

11. A memory device, comprising:
- a memory cell array, including a first dummy word line set, a plurality of word lines and a second dummy word line set arranged in sequence; and
- a memory control circuit, controlling the memory cell array,
- wherein the memory control circuit further performs a programming operation, comprising:
- grouping the plurality of word lines into a plurality of word line groups;
- generating at least one pass bias set, the at least one pass bias set having a plurality of pass biases that are respectively corresponding to each of the plurality of word line groups;
- selecting one of the plurality of word lines for programming, and determining that the selected word line belongs to a specific word line group of the plurality of word line groups; and
- according to a programming sequence, applying a corresponding pass bias in the plurality of pass biases of the at least one pass bias set to at least one dummy word line in one of the first dummy word line set and the second dummy word line set, wherein the corresponding pass bias corresponds to the specific word line group.

12. The programming method according to claim 11, wherein when the programming sequence is a side of the first dummy word line set to a side of the second dummy word line side, the at least one pass bias set is applied to the at least one dummy word line of the second dummy word line set.

13. The programming method according to claim 12, wherein, the closer the specific word line group of the plurality of word line groups is to the second dummy word line set, the corresponding pass bias in the plurality of pass biases is higher.

14. The programming method according to claim 12, wherein a fixed pass bias is applied to dummy word lines other than the at least one dummy word line of the second dummy word line set.

15. The programming method of a memory device according to claim 12, wherein an another dummy word line other than the at least one dummy word line of the second dummy word line set is applied with an another pass bias set.

16. The programming method according to claim 11, wherein numbers of word lines in each of the plurality of word line groups are equal or different.

17. The programming method according to claim 11, wherein the plurality of pass biases in the at least one pass bias set has different values.

18. The programming method of a memory device according to claim 11, wherein two adjacent pass biases among the plurality of pass biases in the at least one pass bias set are equal.

19. The programming method according to claim 11, wherein the memory device is a two-dimensional or three-dimensional NAND flash memory.

20. The programming method according to claim 11, wherein the memory cells of the memory device are single-level cells, double-level cells, triple-level cells or quad-level cells.

* * * * *